(12) United States Patent
Cousin (10) Patent No.: US 9,173,334 B2
(45) Date of Patent: Oct. 27, 2015

(54) INSOLATION MACHINE FOR PANELS FITTED WITH A PANEL TURNER

(71) Applicant: Christophe Cousin, Orvaux (FR)

(72) Inventor: Christophe Cousin, Orvaux (FR)

(73) Assignee: ALTIX, Val de Reuil (FR)

( * ) Notice: Subject to any disclaimer, the term of this patent is extended or adjusted under 35 U.S.C. 154(b) by 228 days.

(21) Appl. No.: 13/797,118

(22) Filed: Mar. 12, 2013

(65) Prior Publication Data
US 2013/0239406 A1 Sep. 19, 2013

(30) Foreign Application Priority Data
Mar. 13, 2012 (FR) .................................. 12 52256

(51) Int. Cl.
B23P 19/00 (2006.01)
H05K 13/00 (2006.01)
G03F 7/20 (2006.01)
H05K 3/00 (2006.01)

(52) U.S. Cl.
CPC .......... *H05K 13/0015* (2013.01); *G03F 7/2022* (2013.01); *H05K 13/00* (2013.01); *H05K 13/0069* (2013.01); *H05K 3/0082* (2013.01); *H05K 2203/1509* (2013.01); *H05K 2203/1563* (2013.01); *Y10T 29/49124* (2015.01); *Y10T 29/53187* (2015.01); *Y10T 29/53191* (2015.01); *Y10T 29/53261* (2015.01)

(58) Field of Classification Search
CPC . Y10T 29/5142; Y10T 29/5145; Y10T 29/53; H01L 21/67; H01L 21/67775; H01L 21/68707
USPC .......... 29/742, 743, 759, 760, 771, 787, 791; 414/217
See application file for complete search history.

(56) References Cited

U.S. PATENT DOCUMENTS

| 7,180,578 B2* | 2/2007 | Gout et al. ...................... 355/72 |
| 2001/0017690 A1 | 8/2001 | Vernackt et al. |
| 2006/0120832 A1* | 6/2006 | Chhibber et al. ............. 414/217 |

FOREIGN PATENT DOCUMENTS

| JP | 2002-323777 A | 11/2002 |
| JP | 2009-157248 A | 7/2009 |

OTHER PUBLICATIONS

European Search Report for corresponding application FR 1252256 mailed Oct. 31, 2012 (2 pages).

* cited by examiner

*Primary Examiner* — Thiem Phan
(74) *Attorney, Agent, or Firm* — Bookoff McAndrews, PLLC (57) ABSTRACT

Machine and insolation method for panels for turning a panel and successively insolating its first and second faces. According to the invention, this machine comprises at least one first insolation station (10), and a panel turner (30), having a first face and a second face, the latter comprising a prehension device (53, 54), configured to grip a panel (90), a displacement device, configured to displace the prehension device at least between the first and second insolation stations (10, 20), and a pivoting device, configured to pivot the prehension device (53, 54) and in this way have the panel (90) pivot about a pivoting axis (A) parallel to said panel (90), the turner (30) being configured so that it can grip the panel (90) by any one of its faces and release the panel (90) also by any one of its faces.

14 Claims, 11 Drawing Sheets

INSOLATION MACHINE FOR PANELS FITTED WITH A PANEL TURNER

This application claims priority under 35 U.S.C. §119 to French patent application FR 1252256, filed Mar. 13, 2012, the contents of which is incorporated herein by reference.

FIELD OF THE INVENTION

The present specification relates to a machine and an insolation method for panels for turning a panel and successively insolating its first and second faces.

The field of application of this invention is mainly that of printed circuits and microprocessors, but the invention can also be used in all fields using processes for image transfer such as for LCD screens or the manufacture of micromechanics articles via chemical cutting.

PRIOR ART

Of the numerous applications employing panel insolation, the majority takes advantage of the two faces of the panel and therefore requires insolation of each of its faces.

A technique frequently used to carry out such double-sided insolation involves insolating the first face of the panel within a first insolation station fitted with a first plate, then transferring the panel, after having turned it, to a second insolation station similar to the first (generally fitted with a different plate) to insolate the second face of the panel. Such a technique offers some specific advantages relative to other known techniques: for example, contrary to techniques of simultaneous insolation of both faces especially, such insolation completed of one face after the other is not shaded by some elements of the device and therefore does not cause non-insolatable zones on the panel.

However, this "double single face" technique requires an operation for turning the panel when it is transferred from the first insolation station to the second: such a turning operation causes numerous design difficulties. So, existing solutions suffer from a certain number of defects.

For example, devices comprising three separate actuator machines are known: a first, mobile according to two axes, searches for the panel on the first insolation station then moves to a second machine to which it transfers the panel; this second machine executes the turning; then a third machine similar to the first recovers the panel from the second machine and sets the turned panel down on the second insolation station. Naturally, it is understood that such a device comprising three separate machines is very bulky and creates a high failure risk as well as considerable investment and maintenance costs. Also, the panel is transferred from machine to machine each time with the risk of upsetting the expected position of the panel, possibly damaging the image transfer quality and even risking a fall and therefore damage to the panel.

There is therefore a real need for a device and insolation process for panels for turning and insolating a panel successively on its two faces and which at least in part have none of the disadvantages inherent to the abovementioned known techniques.

PRESENTATION OF THE INVENTION

The invention relates to an insolation machine for panels, comprising at least one insolation station comprising a base configured to receive a panel flat, and a panel turner, having a first face and a second face; the panel turner comprises a prehension device configured to grip a panel, a displacement device configured to guide the prehension device opposite the base of said at least one insolation station, and a pivoting device configured to pivot the prehension device and accordingly have the panel pivot about a pivoting axis parallel to said panel, the turner being configured so it can grip the panel by any one of its faces and release the panel also by any one of its faces.

In such an insolation machine for panels, the panel turner moves and places its prehension device at the level of a first insolation station which has completed insolation of the first face of the panel, the latter then grip the panel directly from the first insolation station; holding the panel, the displacement device of the turner then moves the prehension device from the first insolation station and the pivoting device pivot the prehension device so as to firmly pivot the panel and present its second face; the displacement device then guides the prehension device holding the panel at the level of a second insolation station which can optionally again be the first insolation station; the prehension device then places the turned panel directly into the second insolation station within which insolation of the second face of the panel is completed.

This is possible because of the turner which is capable of gripping the panel by any one of its faces and also releasing it by any one of its faces, that is, by the same face or by the face opposite the face by which the panel has been gripped.

In this way, a single machine is necessary to make the transfer and turn the panel between the first and second insolation stations. The functions of prehension, transfer and turning of the panel are shared: such an insolation machine for panels is therefore well integrated and easy to execute. Particularly compact, it integrates easily into a manufacturing chain. It is also particularly simple and therefore more economical both in terms of investment and maintenance. Also, it is remarkably reliable. In fact, the panel can be gripped flat and set back down flat directly on the working planes of the insolation stations, without any other intermediate transferral: proper positioning of the panel is easily preserved and falls are avoided at the time transferral. Such a machine is also particularly rapid since only two transfers are necessary and turning can be done along with shifting to the second insolation station.

In some embodiments, the machine comprises just a single insolation station. In such a case, the turner grips the panel by its first face at the level of the sole insolation station which has completed insolation of the first face of the panel; the turner, holding the panel, then moves away from the first insolation station and pivots solidly with the panel to present its second face; the turner then returns to the level of the sole insolation station and via its second face releases the turned panel in the insolation station. Such a highly compact configuration is particularly interesting when the same plate must be insolated on both faces of the panel or when the plate can be modified rapidly between the insolation of each face, especially in the case of a digital plate such as used in "direct imaging" technologies.

In some embodiments, the machine comprises a first insolation station and a second insolation station, each insolation station comprising a base configured to receive the panel flat, and the displacement device is configured to guide the prehension device opposite the base of each insolation station. This configuration is particularly interesting when different plates must be insolated on each face of the panel: it is possible in fact to insolate panels in a chain, with a fresh panel to be insolated arriving in the first insolation station while the turner turns and transports the panel insolated once to the second insolation station.

In some embodiments, the or each insolation station comprises a base configured to receive the panel flat. This flat arrangement enables both reliability of transferral with the turner and higher image transfer quality during insolation, especially due to easier orientation of the panel.

In some embodiments, said base is fitted with an elevator, allowing it to rise or descend, the displacement device being configured to guide the prehension device opposite the base of the insolation station. This elevator controls the position of the panel both during insolation and transferral with the prehension means of the turner to ensure reliability and quality. Also, it frees up space necessary for passage of the prehension device but also of other mobile elements of the insolation machine, and especially the mobile panel loader, allowing the panel to be placed on the base of the first insolation station. Finally, this elevator makes it possible to limit displacement of the turner to simple horizontal translation, simplifying its design.

In some embodiments, the or each insolation station comprises also an insolation unit, or cover, fitted with an insolation device and configured to support a plate, the insolation unit of the insolation station being fixed. Traditionally, it is the base which is fixed and the insolation unit mobile to press the insolation device and the plate against the panel to be insolated; here, inversion of these characteristics conserves this proximity requisite between the panel, the plate and the insolation device (the base presses the panel against the insolation unit) and offers the above advantages and especially permanent control of the position of the panel without the latter leaving the base and therefore risking falling. Also, this configuration is as compact, if not more so, as the configuration with a mobile insolation unit.

In some embodiments, the or each insolation station functions according to "direct imaging" technology. In such a case, the insolation unit may not be configured to bear a plate, the insolation device then being configured to project the preferred pattern directly.

In some embodiments, the base and the insolation unit of the same insolation station are opposite: in such a case, the base is mobile in the vertical axis only.

In other embodiments, the base is not opposite the insolation unit bearing the insolation means when the panel is withdrawn or set down. In such a case, the base can be mobile on at least two axes, allowing it to align with the insolation unit then come closer to the latter. In other cases, the base is mobile only according to the vertical axis but has loading means, a belt conveyor for example, allowing it, once the panel is set down, to load it into an insolation space situated opposite the insolation unit bearing the insolation means.

In some embodiments, the base comprises holding means of the panel, fixing the position of the panel relative downwards; this holding can be done by suction elements such as suction nozzles or controlled suction cups which hold the panel by suction. The reliability of insolation and transferral with the turner is greater accordingly.

In some embodiments, the turner comprises a support and a frame substantially rectangular cooperating with the support by means of two trunnions arranged on the frame, or on the support, coaxially and on either side of the frame, defining a pivoting axis of the frame relative to the support, said axis corresponding to said pivoting axis of the panel. The frame comprises two longitudinal crossbars, preferably parallel to the pivoting axis, bearing the prehension device. The pivoting device, carried preferably by the support, drives at least one of said trunnions to pivot the frame relative to the support. The prehension device is solid with the frame: when the panel is gripped by the prehension device, it is therefore accommodated within the frame and becomes solid with the latter. The frame is mobile in rotation relative to the support and solid with the latter in translation. The translation and pivoting movements of the panel are advantageously and simply detached. Also, in this way the panel is gripped by its edges: since these rims are holding zones not intended to be insolated, the prehension device therefore does not encroach on the useful zone of the panels the surface quality of which is retained. Also, this configuration of the prehension device grips panels of varying sizes and even very fine panels, of a thickness of less than a mm especially, which would normally risk bending if they were not held by their edges.

In some embodiments, the support cooperates with at least one rail of the insolation machine along which it is mobile and driven by the displacement device. The use as a rail allows simple design and easier execution, especially of the displacement device, by limiting the drive to a single degree of liberty.

In some embodiments, said rail is horizontal, with displacement of the support being limited to horizontal displacement. In this way, the horizontal movements of the panel, ensured by the displacement device of the turner, are detached from its vertical movements, ensured by the elevator of each insolation station.

In some embodiments, the displacement means comprise a motor driving displacement of the support along said rail by means of a belt system.

In some embodiments, the support cooperates with a first rail of the insolation machine along which it is mobile and driven by the displacement device and a second rail of the insolation machine, opposite the first rail, along which it is freely mobile. This cooperation with this second rail can be done by means of rollers. In this way, the support and therefore, the frame, are not at odds. They are now stabilised and retain the correct inclination.

In some embodiments, the prehension means comprise, for each crossbar, a plurality of controlled suction cups. These can be controlled individually or in groups to maintain suction and therefore hold the panel, or interrupt suction and therefore release the panel.

In some embodiments, each crossbar comprises two strips, each fitted with a rotary drive device allowing it to pivot about an axis parallel to said crossbar, and each strip is fitted with a plurality of controlled suction cups connected to a vacuum pump and acting as prehension device. The rotary drive device recloses the two strips fitted with suction cups on either side of an edge of the panel to squeeze it between these two strips.

In some embodiments, the drive device is preferably a rotary jack.

In other embodiments, it is a motor.

In some embodiments, the strips of the same crossbar are offset relative to their pivoting axes such that they can extend side by side in the same plane or opposite, the suction cups of one being directed towards the suction cups of the other. The edge of the panel is squeezed compactly, simply and reliably or a space necessary for passage of the panel during its arrival or departure is left, and this is from both sides of the frame.

In some embodiments, at least one suction cup is fitted with an automatic valve which closes when no object is applied against said suction cup. So, the turner adapts automatically to the length of the panel to be insolated without particular adjustment: if a panel is smaller and a suction cup is located outside the field occupied by the panel, the valve of the latter closes to preserve the suction force of the other suction cups.

In some embodiments, at least one suction cup is fitted with a spring which pushes it back away from the strip on which it is mounted. It is possible to adapt the turner without particular adjustment to panels of different thickness. There are also no problems of variable clearances due to imprecise adjustment of the implanting of the suction cups or poor surface quality of the panel.

In other embodiments, at least one suction cup is mounted on a jack. Other than the above advantages, there is also an additional degree of liberty at the level of the suction cups allowing more precise engagement and disengagement of the prehension of the panel.

In some embodiments, the suction cups are round. They preferably have a diameter equal to or less than 20 mm.

In other embodiments, the suction cups are oval. They preferably have a width equal to or less than 7 mm. In this way, for an equal suction force, by aligning the suction cups longitudinally along an edge of the panel it is possible to reduce the encroaching of the suction cups on the surface of the panel to retain its surface quality.

In some embodiments, each strip comprises eight suction cups arranged uniformly along the strip. Implanting of the suction cups is preferably identical on each strip.

In some embodiments, each crossbar is mounted between two opposite carriages, each carriage being mobile and driven along a rail of the frame. In this way, it is possible to easily adapt the turner to different panel widths. This can be done automatically due to the simple fact of the size of the panel or after detection of the size of the panel by sensors.

In some embodiments, each carriage cooperates with a guide rail arranged along said rail of the frame. This guide rail is preferably a bar.

In some embodiments, an Archimedes screw is arranged along at least one of said rails. An Archimedes screw is preferably arranged along each rail along which a guide rail extends.

In some embodiments, some carriages comprise a motor meshing on said Archimedes screw to ensure their displacement along said rails. In particular, each carriage can comprise such a motor. This motor is preferably of the step type to ensure precision in positioning the carriage.

In other embodiments, the Archimedes screw can be driven in rotation by a step motor fixed to the frame and the carriage can progress along this screw by way of a nut meshing on said screw.

In some embodiments, each carriage comprises the rotary jack of a first strip of the crossbar and a bearing supporting the second strip of the same crossbar. This configuration is more compact and fits better in the frame.

In some embodiments, the pivoting device comprises a motor, mounted on the support, which drives one of the trunnions of the frame to pivot the frame in a range of inclination of at least 180° in amplitude.

In some embodiments, and compactly, said motor drives said trunnion by means of angle transmission reduction gearing.

In other embodiments, it can drive it by means of a transmission belt.

In some embodiments, the trunnions are arranged on the frame in such a way that the pivoting axis of the frame is a median of said frame. The volume scanned by the frame during its pivoting is reduced.

In some embodiments, the pivoting axis of the frame is horizontal and said range of inclination includes at least the two horizontal positions, one directed upwards, the other directed downwards.

The present specification also relates to an insolation process for panels using an insolation machine according to any one of the embodiments described hereinabove.

The above features and advantages, as well as others, will emerge from the following detailed description of an embodiment of the device and of the proposed process. This detailed description makes reference to the attached drawings.

BRIEF DESCRIPTION OF THE DRAWINGS

The attached drawings are schematics and aim primarily to illustrate the principles of the invention.

In these drawings, from one figure (FIG) to the other, identical elements (or parts of elements) are designated by the same reference numerals.

DETAILED DESCRIPTION OF AN EMBODIMENT

To make the invention more specific, an example of device and process is described in detail hereinbelow, in reference to the attached drawings. It is noted that the invention is not limited to this example.

Figure 1A:
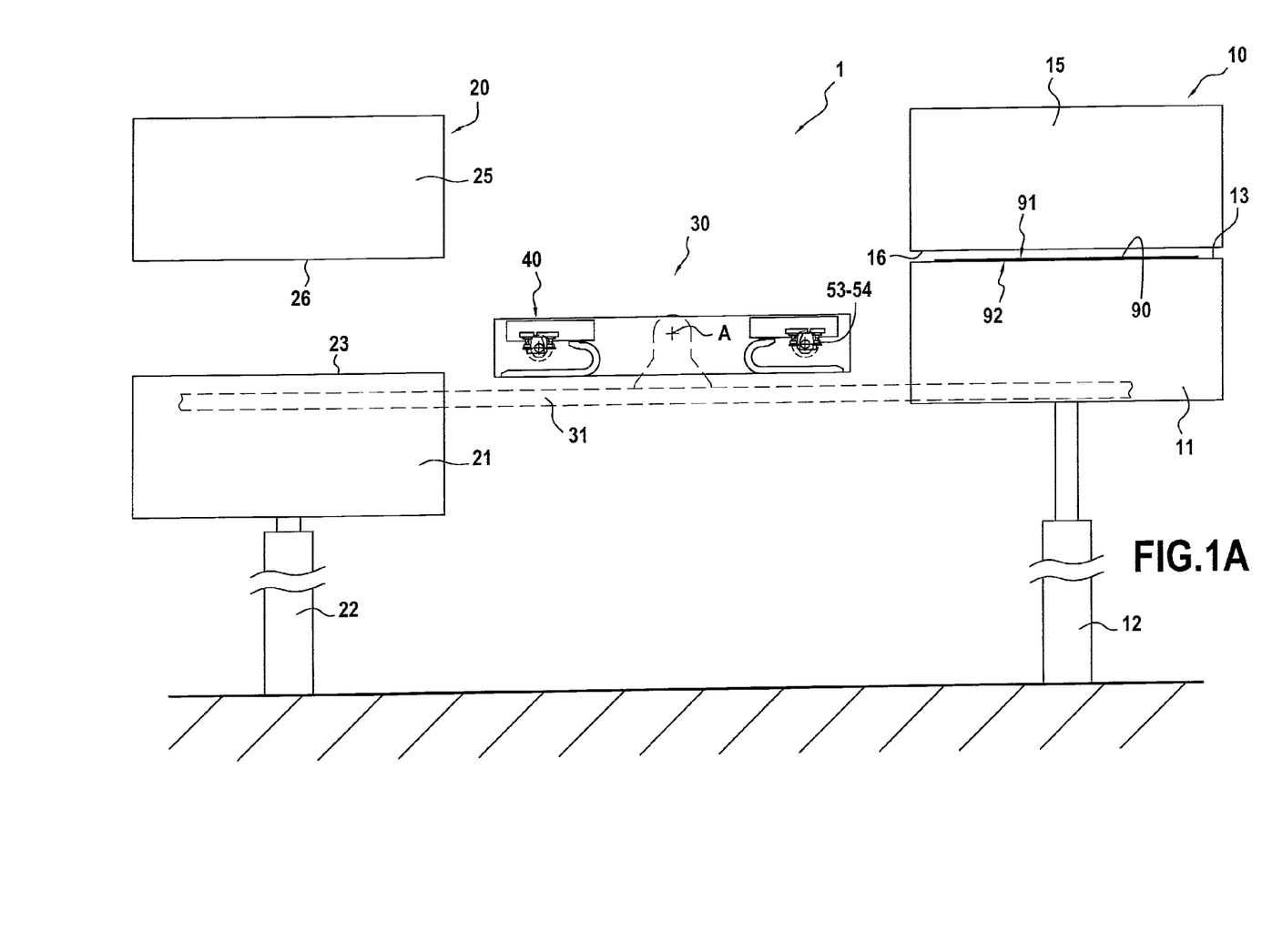
FIG. 1A is a schematic illustration of an example of an exposure machine viewed from the front.

In the present detailed description, indications of direction or position (up, down, right, left, front, rear, internal, external, etc.) are defined relative to the frame 40 in its non-turned state viewed from the front such as illustrated in FIG. 1A. Also, in terms of the direction of a suction cup 53, 54, this means the direction to which the head of the suction cup 55 points.

Figure 1B:
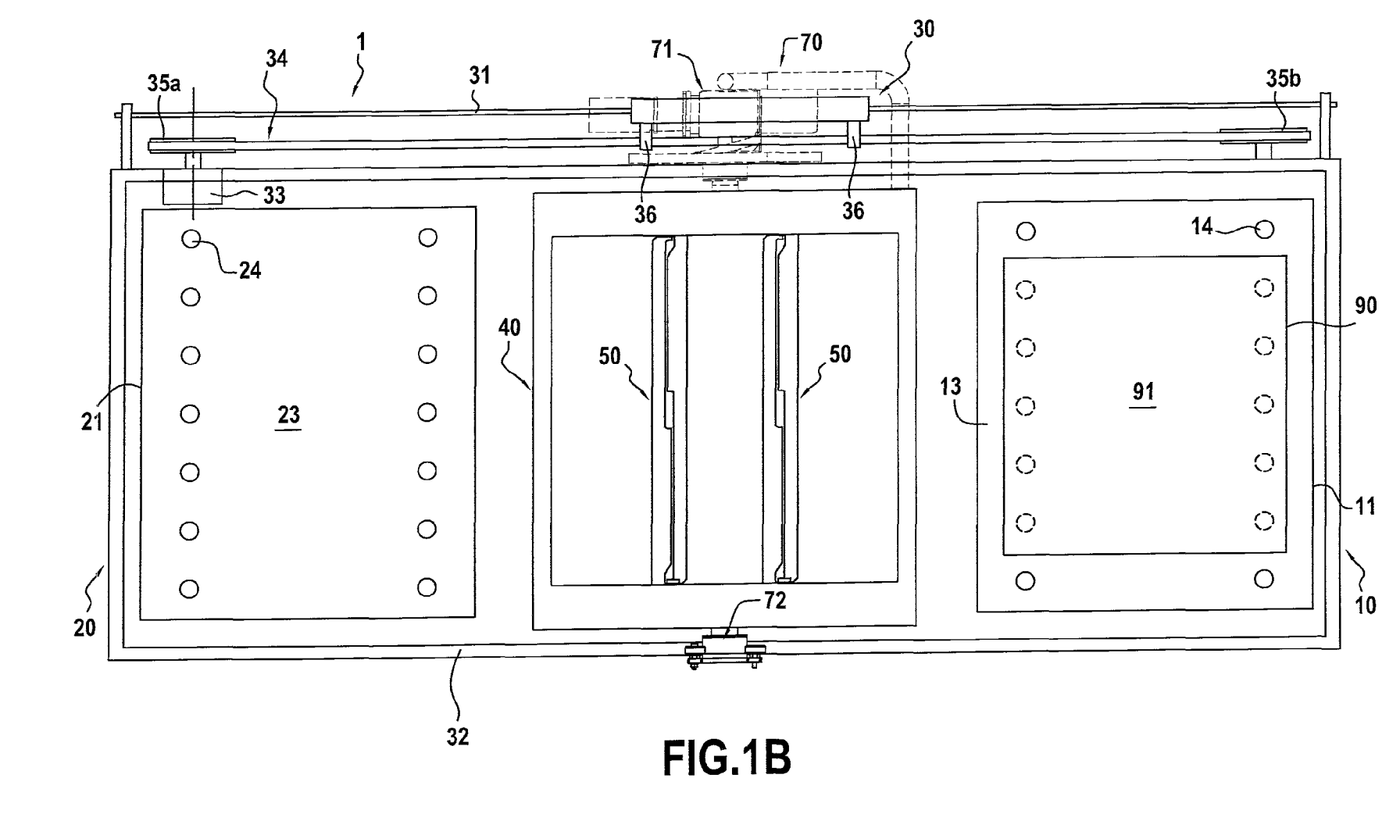
FIG. 1B is a schematic illustration of the example of an exposure machine of FIG. 1A viewed from above.

FIGS. 1A and 1B schematically illustrate all the elements of an embodiment of an exposure machine 1 according to the invention viewed in elevation and from above respectively.

The machine 1 comprises a first insolation station 10, a second insolation station 20, similar to the first 10, a mobile panel loader (not illustrated), a mobile panel unloader (not illustrated) and a turner 30.

Each insolation station 10, 20 comprises a base 11, 21 and an insolation unit 15, 25. Each base 11, 21 has at its upper end a flat and horizontal work table 13, 23 designed to receive a panel 90 to be insolated; the work tables 13 and 23 are equipped on their surfaces with suction nozzles 14, 24 for keeping the panel 90 in position on the work table 13, 23 by suction. Each base 11, 21 is also fitted with an elevator 12, 22 allowing it to adjust the level, that is, the altitude, of the work table 13, 23. Each insolation unit 15, 25 is fitted with insolation means comprising UV light-emitting diodes and has at its lower end a platen 16, 26 behind which a plate representing the negative of a pattern to be projected and reproduced on the panel 90 can be adapted. The first insolation station 10 is intended to insolate the rear side 91 of the panel 90 while the second insolation station 20 is intended to insolate the rear face 92 of the panel 90.

The mobile panel loader searches for a panel 90 in a section upstream of a production chain of electronic components and sets them down on the work table 13 of the first insolation station 10. The mobile panel unloader searches for a panel 90 on the work table 23 of the second insolation station 20 and takes it to a section downstream of the production chain.

The turner 30 comprises a frame 40 mounted in rotation on a support 70, composed of a first support part 71 and a second support part 72 opposite the first part 71 relative to the frame 40. The support 70 is in turn mounted in translation on horizontal rails 31, 32 fixed to the frame of the machine 1, the first support part 71 cooperating with a first rear horizontal rail 31 and the second support part 72 cooperating with a second rail front horizontal 32 fixed opposite the first rail 31. The turner 30 also comprises a displacement device fixed to the frame of the machine 1 driving the first support part 71 in translation along the first rail 31. In this embodiment, the displacement device comprises a motor 33 fitted with a belt drive system 34. In this example, a belt 34 runs between a first pulley 35a fixed to the axis of a motor 33 fixed to a first end of the frame and a second pulley 35b fixed to a second end of the frame; the first support part 71 is attached at one or more fastening points 36 of the belt 34. In this way, rotating the motor 33 drives the belt 34 and therefore the support 70 along the rails 31 and 32.

Figure 2:
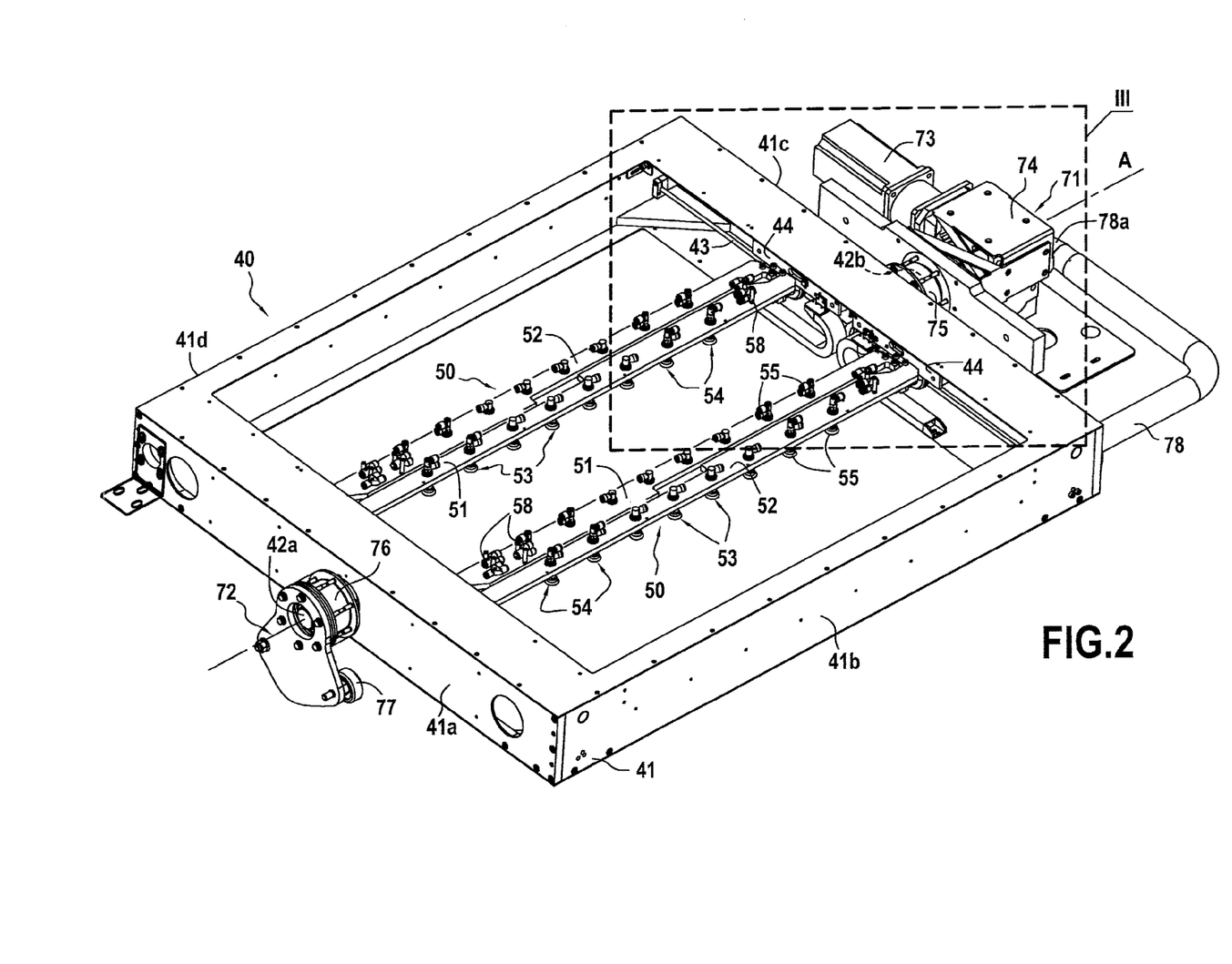
FIG. 2 is a perspective view of an example of a turner according to the invention.
Figure 3:
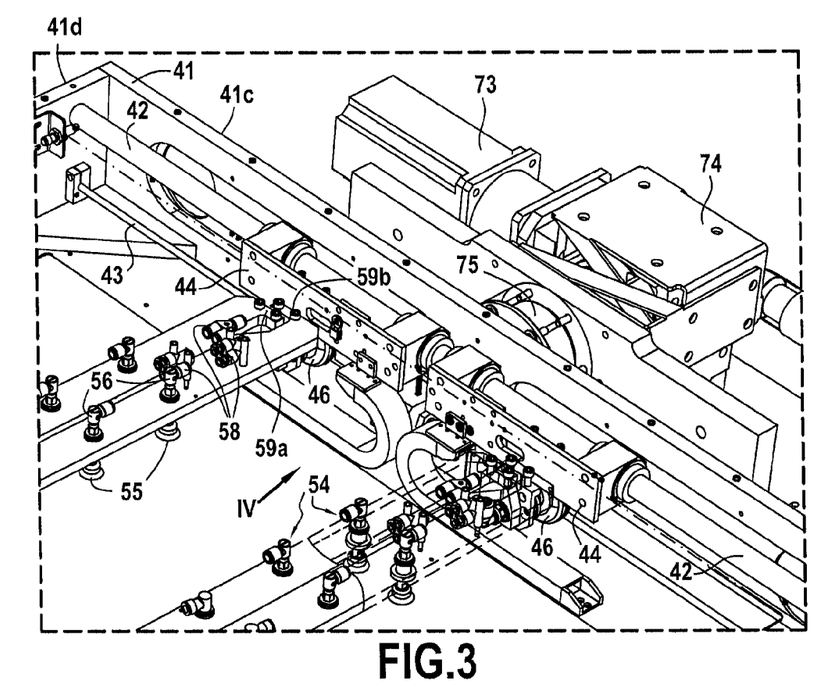
FIG. 3 is an enlargement of part of this example of a turner corresponding to the frame III of FIG. 2.
Figure 4:
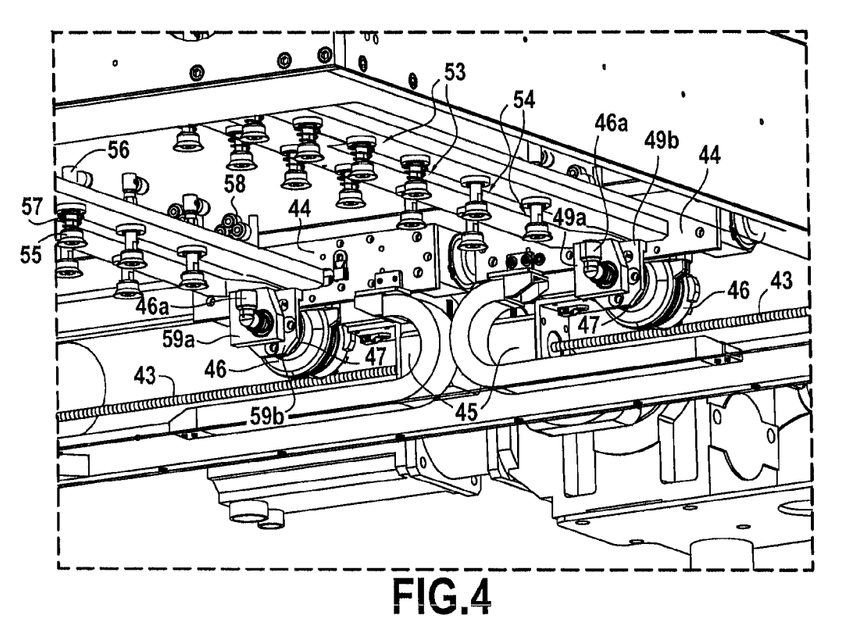
FIG. 4 is a perspective view of another part of the turner according to arrow IV of FIG. 3.

FIGS. 2, 3 and 4 illustrate the frame 40 and the support 70 of the turner 30 at different angles. More particularly, FIG. 3 is an enlargement of the frame III of FIG. 2 and the FIG. 4 is a view in the direction IV of FIG. 3.

The frame 40 comprises four rails, respectively front 41a, right 41b, rear 41c and left 41d, forming a rectangular chassis 41. The front 41a and rear 41c rails have respectively, in the centre of their external faces, a front trunnion 42a and a rear trunnion 42b (masked in figures) allowing the frame 40 to cooperate with the support 70. These two coaxial trunnions 42a, 42b define a pivoting axis A of the frame 40 relative to the support 70; this pivoting axis A is parallel to the right 41b and left 41d rails of the frame 40.

The frame 40 also comprises a guide bar 42 fixed to the chassis 41 along its rear rail 41c and extending parallel to the overall plane of the frame 40 on one side and to the rear rail 41c on the other side. The frame 40 also comprises, along the same rear rail 41c, an Archimedes screw 43 fixed to the chassis and extending parallel to said guide bar 42. In this embodiment, the guide bar 42 is arranged near the upper edge of the rear rail 41c while the Archimedes screw 43 is arranged near the lower edge of the rear rail 41c. A second guide bar 42 and a second Archimedes screw 43 are also arranged perfectly similarly along the rail front 41a of the chassis 41.

Around each guide bar 42 are arranged two carriages 44 mounted to slide along the guide bar 42. Some carriages 44 are fitted with a step motor 45 which meshes on the Archimedes screw 43 to drive these carriages 44 along the front 41a or rear 41c rail.

Each carriage 44 arranged along the rear rail 41c is connected to a carriage 44 arranged along the rail front 41a, these two joined carriages 44 being connected by a crossbar 50 overall parallel to the pivoting axis A. In this embodiment, a carriage 44 in each pair of joined carriages 44 has no step motor 45, its displacement being solid with the other carriage of its pair by way of the rigid junction offered by this crossbar 50. In other embodiments, each carriage 44 has its own step motor 45: the step motors 45 of the two carriages 44 of the same pair are activated simultaneously to allow synchronised displacement of these carriages 44.

Each crossbar 50 comprises an internal strip 51 and an external strip 52, each taking the form of a fine and elongated plaque, resembling a ruler, parallel to the pivoting axis A. The first end of each of these strips 51, 52 is fixed to a first carriage 44 while its second end is fixed to the carriage 44 joined to said first carriage 44.

Each strip, internal 51 or external 52, is fitted with a plurality of suction cups 53, 54. Each suction cup 53, 54 comprises a suction cup head 55, intended to be applied against the panel 90 and directed to the median plane of the frame 40, and a nozzle 56 for connecting the suction cup 53, 54 to a vacuum pump by means of a flexible tube. Suction cups 53, 54 are also fitted with respective springs 57 repelling the suction cup head 55 away from the strip 51, 52 on which they are mounted and adapting to different thicknesses of panels 90 and compensating for some surface defects of the panel 90 or some clearances in the assembly of the frame 40. Also, some suction cups 54 are fitted with respective automatic valves which automatically cut suction when no object, and especially the panel 90, is applied against such suction cups 54 so as to preserve the suction force of the other suction cups 53, 54. Other suction cups 53, arranged at the centre of the strips 51, 52, have no valve because irrespective of the size of the panel 90 the latter is still applied against these suction cups with no valve 53.

In this embodiment, each strip 51, 52 has eight suction cups 53, 54 distributed uniformly, at fixed intervals, all along the strip 51, 52. Among these suction cups, the four central suction cups are suction cups devoid of valve 53 while the two groups of two suction cups flanking these suction cups devoid of valve 53 are suction cups provided with valve 54.

Each strip 51, 52 is also fitted with connectors 58 arranged at the end of the strip for dividing a tube originating from the vacuum pump into a plurality of tubes, each connected to the nozzle 56 of a given suction cup 53, 54. The suction cups 53, 54 are controlled strip by strip 51, 52. To keep the figures uncluttered, these networks of tubes are not illustrated.

Each strip 51, 52 is mounted between a rotary pneumatic jack 46 on one side, provided on its first carriage 44, and a bearing 47 on the other side, provided on its second carriage 44. In this way, each strip 51 and 52 can be driven in rotation by its rotary jack 46 about a jack axis V parallel to the pivoting axis A.

Figure 5A:
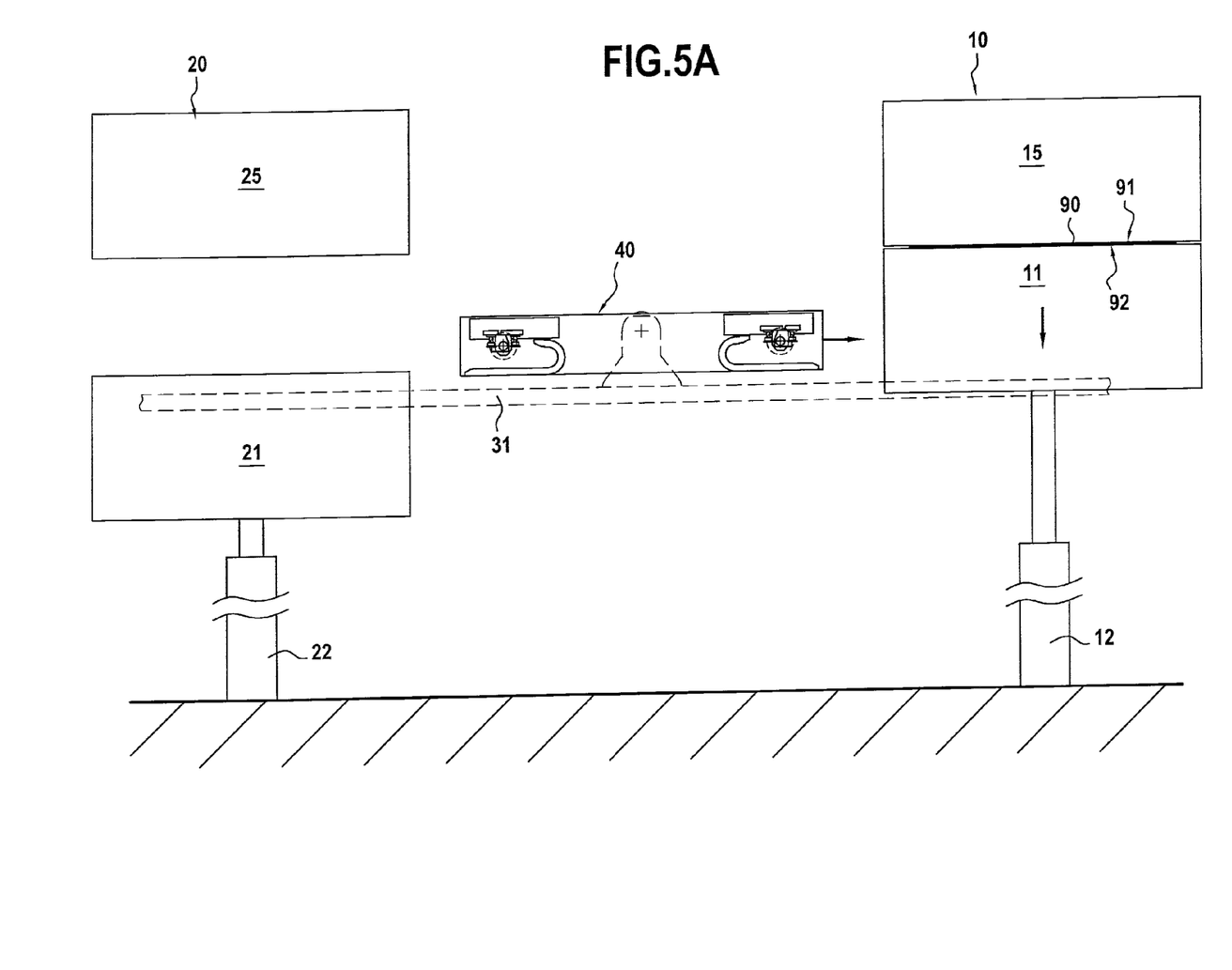
FIG. 5A to 5G are schematic representations of different phases of the process implementing the machine of FIG. 1A.
Figure 5B:
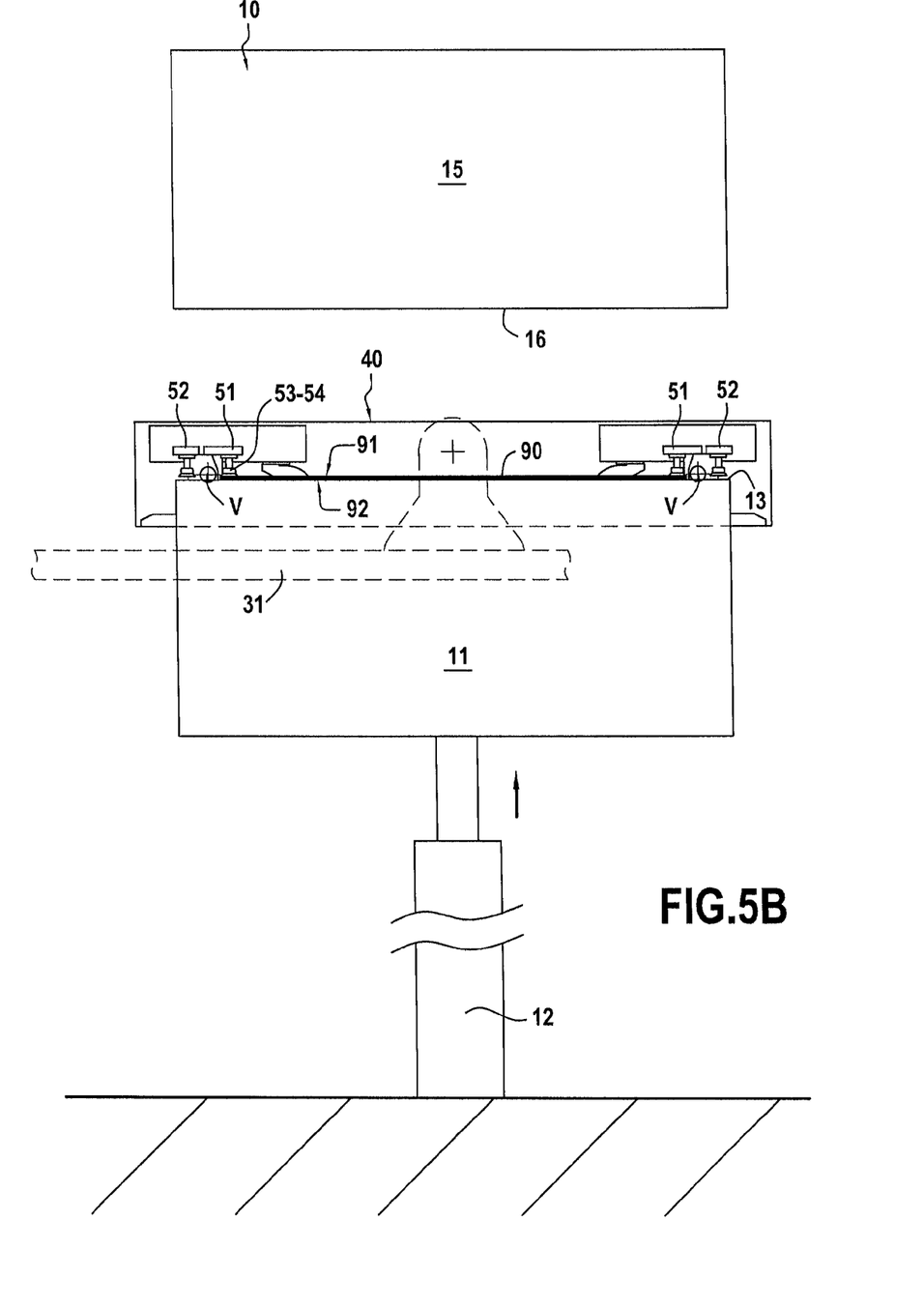
Figure 5C:
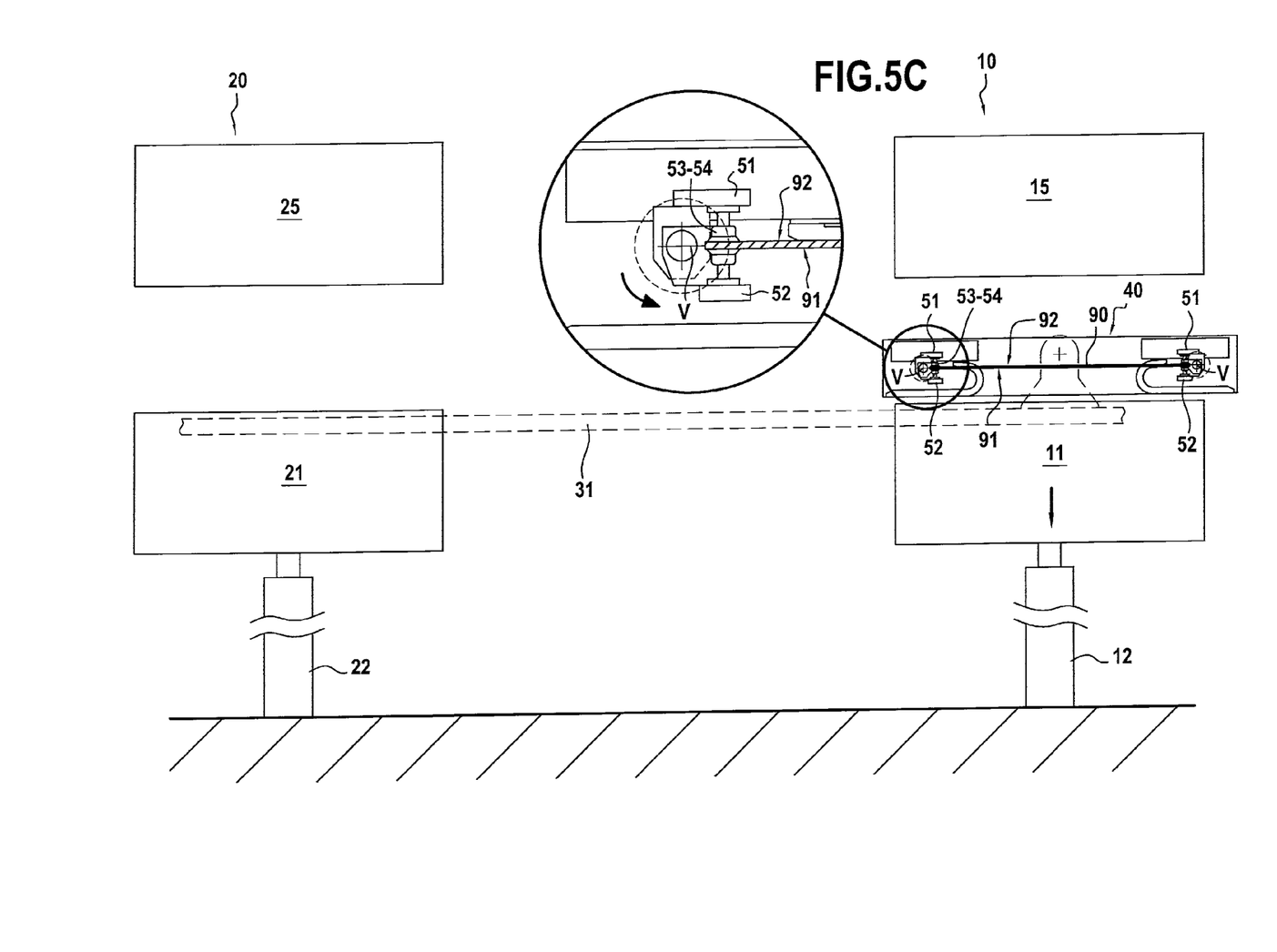
Figure 5D:
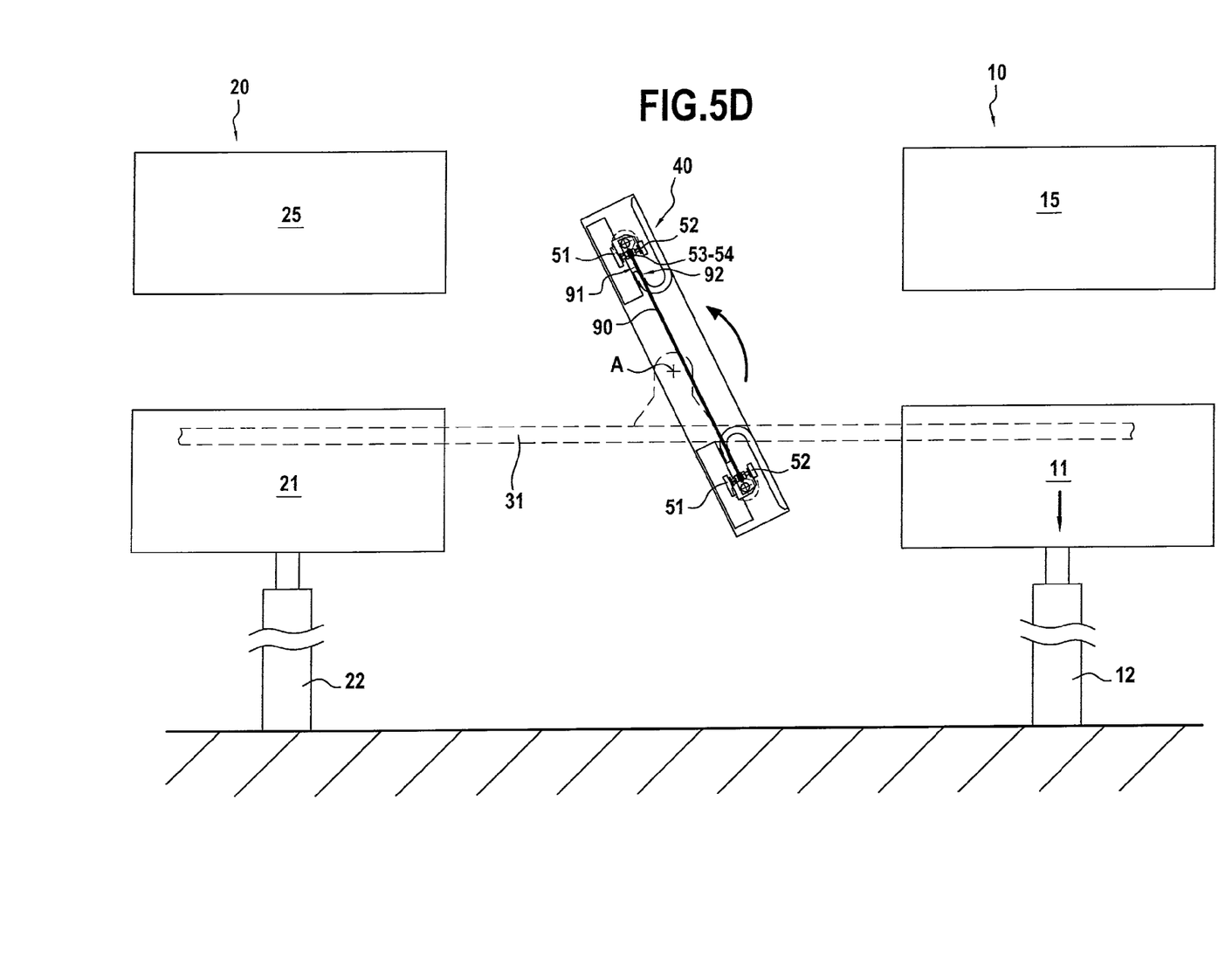
Figure 5E:
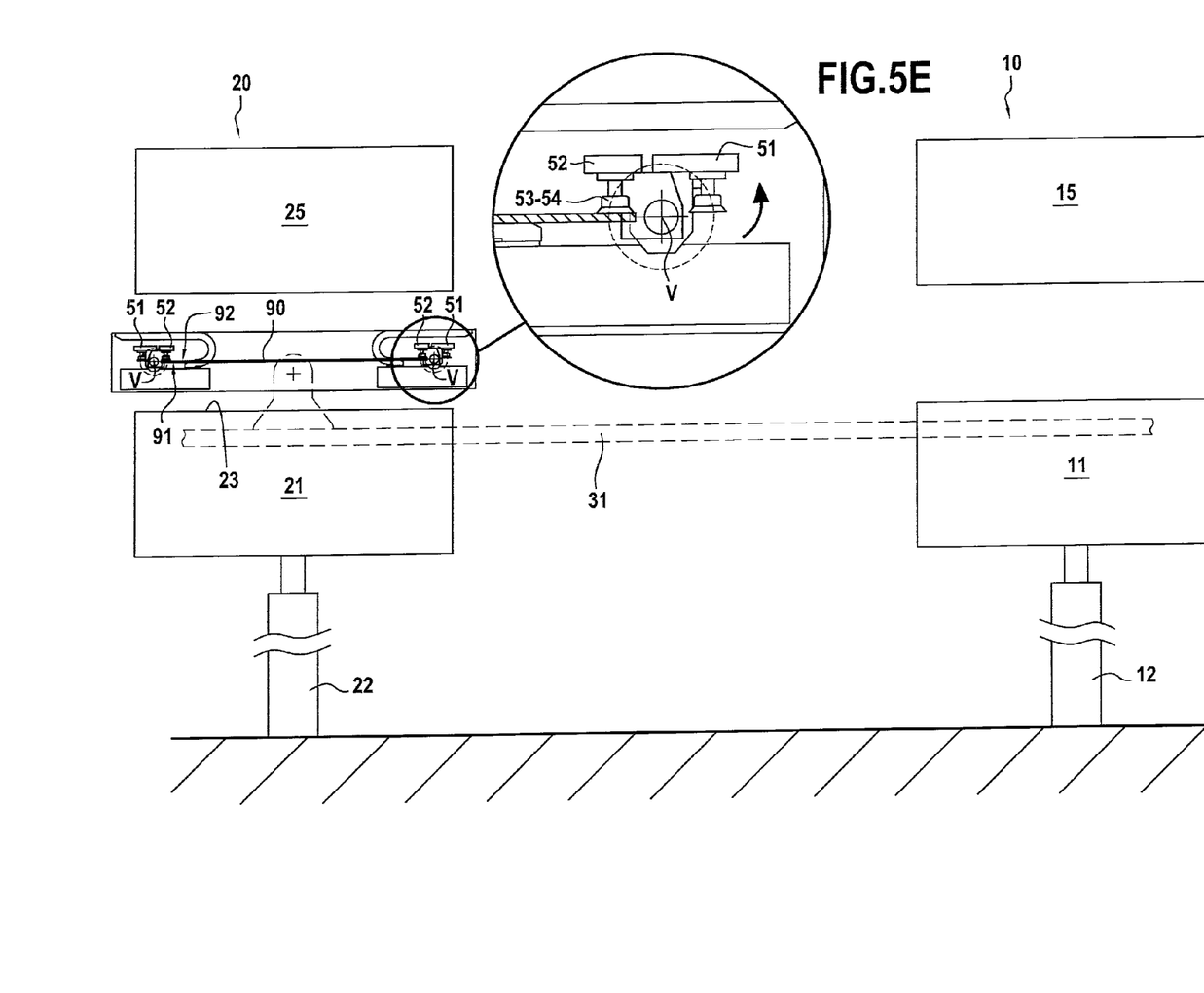
Figure 5F:
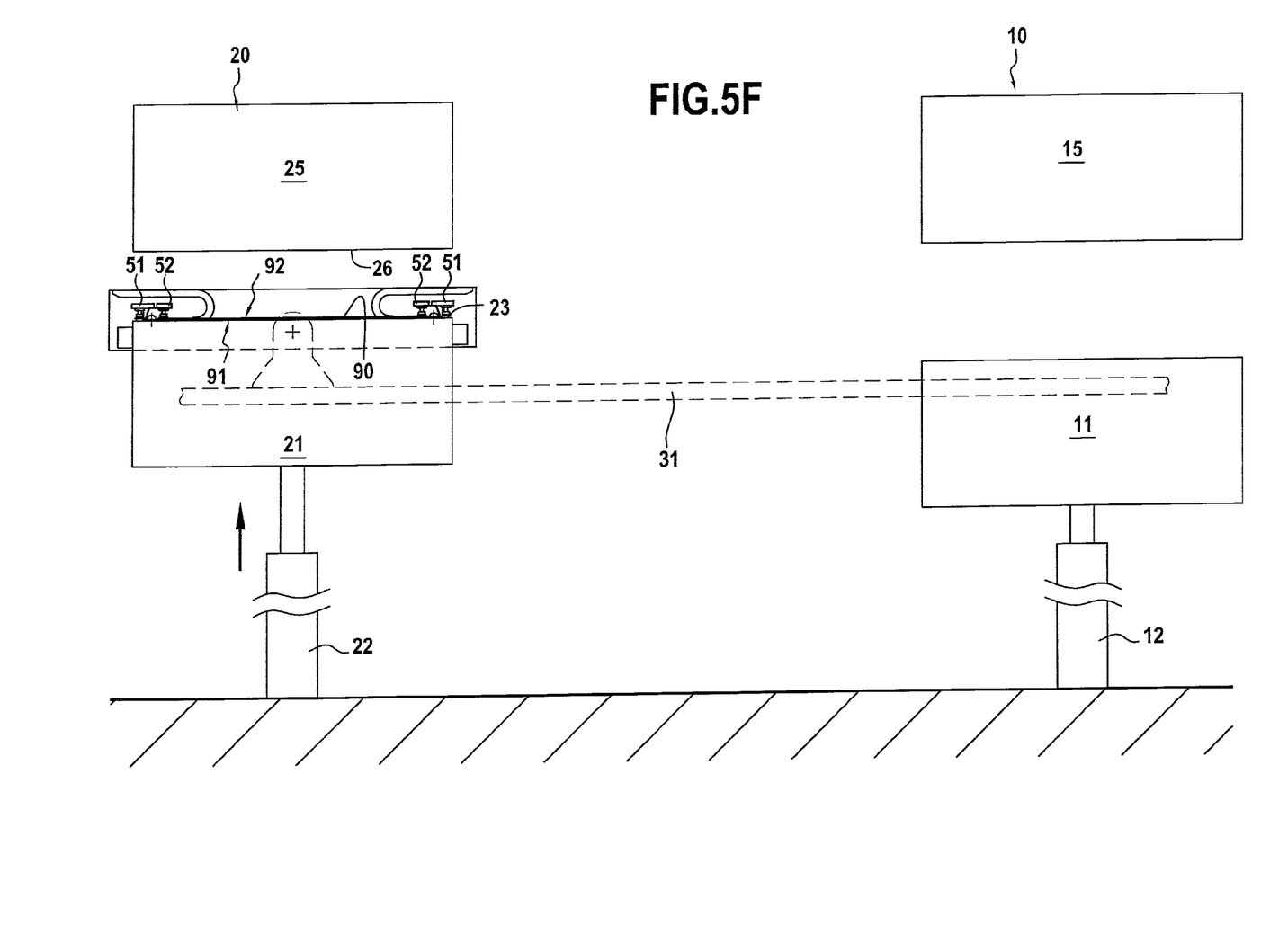

In particular, the strips 51, 52 are mounted on their respective jacks 46 and their bearings 47 by means of brackets 59a and 59b in such a way that the strips 51 and 52 of each crossbar 50 can extend one beside the other, their respective suction cups 53, 54 directed towards the bottom of the frame 40 (see FIG. 5B), one opposite the other, their respective suction cups 53, 54 directed opposite (see FIG. 5C), or one beside the other, their respective suction cups 53, 54 directed towards the top of the frame (see FIG. 5F on which the frame top is directed downwards in the figure, said frame having been turned).

In this embodiment, each carriage 44 has a jack 46 for a first strip 51, 52 of its crossbar 50 and a bearing 47, concentric to the axis V of the rotary jack 46, for the second strip 51, 52 of its crossbar 50. Each rotary jack 46 is fitted with a nozzle 46a for connection to a pneumatic control circuit (not illustrated for clarity of the figures).

All the suction cups 53, 54 doubly constitute prehension means of the panel 90. On the one hand, the suction cups 53, 54 grip and hold the panel 90 by suction. On the other hand, when the strips 51 and 52 are closed opposite each other, in the manner of a jaw, the panel 90 is squeezed between the suction cups 53, 54 of a first strip 51 or 52 and those of the second strip 51 or 52, ensuring proper prehension of the panel 90.

It should also be noted that the frame 40 can adapt rapidly and easily to different sizes of panels 90. In fact, adaptation in width is done by adjusting the spread of the crossbars 50, that is, by shifting the carriages along the guide bars 42 by means of the step motors 45. This adjustment can be done automatically simply by entering the size of the panel 90 into the control software of the machine 1. As for adaptation in length, the latter is done automatically and without any adjustment by means of the suction cups provided with valves 54: the suction cups 54 arranged outside the field of the panel 90 are in fact automatically deactivated, which retains the prehension efficacy of the other suction cups 53 or 54.

In reference now to the support 70, its first part 71 comprises a pivoting motor 73 which, via angle transmission reduction gearing 74, drives the trunnion rear 42b of the frame 40 to pivot the frame 40 about the pivoting axis A. A rear bearing 75 also supports rotation of the rear trunnion 42b. In this embodiment, angle transmission reduction gearing 74 is used to enable a compact configuration in which the motor 73 is arranged in the overall plane of the frame 40 and along the rear rail 41c of the latter.

The first part 71 of the support 70 also comprises cooperation means with the horizontal rear rail 31 and the belt 34 of the displacement device, not illustrated in the detailed views of FIGS. 2, 3 and 4.

The second part 72 of the support 70 comprises a front bearing 76 supporting and enabling free rotation of the front trunnion 42a of the frame 40. The second part 72 of the support 70 also comprises rollers 77 allowing it to move freely along the horizontal front rail 32 of the machine 1.

To allow passage of all the electrical, pneumatic and vacuum feeds from the support 70 to the frame 30, a bent tube 78 is provided at a lateral end of the rear rail 41c of the frame 40: the latter is bent so as to point to the first part 71 of the support 70, at the rear of the pivoting motor 73 and near the pivoting axis A. A flexible section 78a then connects the support 70 to this bent tube 78 and follows the latter during its pivoting about the pivoting axis A.

An example of a panel insolation method using the insolation machine 1 as described will now be explained in reference to FIG. 5A to 5G.

The initial state of this method is a state in which the mobile panel loader deposits a panel 90 on the work table 13 of the base 11 of the first insolation station 10. Once the panel 90 is set down in position, the suction nozzles 14 are activated for keep the position of the panel 90. The elevator 12 then lifts the base 12 to press the work table 13 and the panel 90 against the platen 16 of the insolation unit 15 of the first insolation station 10: this step is illustrated in FIG. 5A. In this position of close proximity, the insolation means of the insolation unit insolate the rear side 91 of the panel 90 via the plate arranged behind the platen 16: the negative of the plate is printed onto the rear side 91 of the panel 90.

Once insolation of this rear side 91 is complete, the base 13 redescends via the elevator 11 as far as a level allowing passage of the frame 40 between the base 13 and the insolation unit 15. When said passage is sufficient, the frame 30 is moved by the displacement device opposite the base 13: the latter rises back up until it presses the panel 90 against the suction cups 53, 54 of the internal strips 51 of the crossbars 50. Adjustment of the position of the carriages 44 has been completed so that the suction cups 53, 54 of the internal strips 51 are applied most closely to the lateral edge of the panel 90 and in any case so that the axes of the jacks V extend outside the panel 90. As a consequence, at this stage the suction cups 53, 54 of the external strips point into the void. This step is illustrated in FIG. 5B. At this stage, the suction of the suction nozzles 14 of the base 13 is cut, creating a vacuum in the suction cups 53, 54 of the internal strips 51 such that the panel 90 adheres to the latter.

The base 13 redescends to allow the external strips 52 to fold back on the lower face, that is, the rear face 92, of the panel 90. This step is illustrated in FIG. 5C. The panel 90 is again squeezed between the suction cups 53, 54 of the internal 51 and external 52 strips of the frame 40, creating a vacuum in the suction cups 53, 54 of the external strips 52.

With the panel 90 now firmly gripped by the strips 51, 52 of the frame 40, the frame moves horizontally to a position substantially halfway between the two insolation stations 10 and 20. Now in this median position, the pivoting motor 73 turns the frame 40 through 180° which is now head down. This turning step is illustrated in FIG. 5D. In some embodiments, horizontal displacement from the first insolation station 10 to the second insolation station 20 and turning of the frame 40 take place simultaneously.

When the frame 40 arrives at the level of the second insolation station 20, the base 21 of the second station 20 is lowered to allow necessary passage for the frame 40. As is illustrated in FIG. 5E, once the frame 40 is opposite the base 20 the suction is cut in the suction cups 53, 54 of the internal strips and the internal strips 51 in turn fold back downwards from the frame (that is, upwards in FIG. 5E, the frame having been turned), accordingly opening the jaws comprised by the suction cups 53, 54 of the internal 51 and external 52 strips. In this respect it is evident that the internal strips 51 are now outside the external strips 52 relative to the centre of the frame 40.

The panel 90 is simply held by the suction of the suction cups 53, 54 of the external strips 52 (now inside) while the base 22 is raised until it contacts the panel 90. As a consequence, the vacuum is discontinued in the suction cups 53, 54 of the external strips and the panel 90 is therefore directly in position on the work table 23 of the base 22 without having undergone any jolts. The suction nozzles 24 of the base are then triggered to hold the panel 90 in position on the work table 23. This step is illustrated in FIG. 5F. At this point it is evident that the face of the panel 90 exposed to the insolation unit 25 of the second insolation station 20 is now the rear face 92.

Figure 5G:
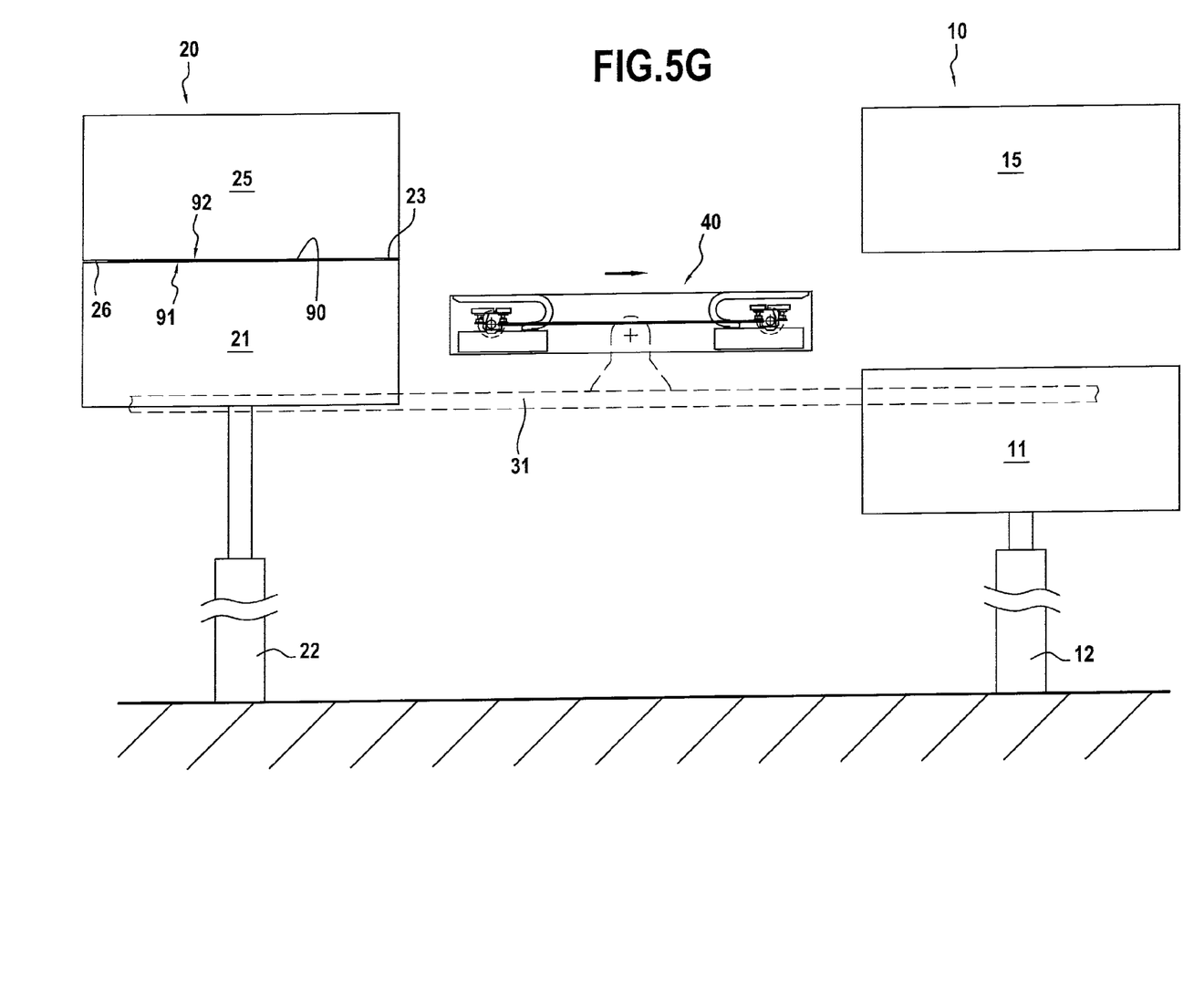

The base 21 redescends sufficiently to release the frame 40 then rises until it presses the work table 23 and the panel 90 against the platen 26 of the insolation unit 25: insolation of the rear face 92 of the panel 90 then takes place. This step is illustrated in FIG. 5G.

Once the insolation of the rear face 92 of the panel 90 is complete, the base redescends and the mobile loader recovers the panel 90 now insolated on its two faces 91 and 92.

To simplify the specification, this kinematic has shown insolation of a single panel 90 only. However it is understood that the operations described above can be integrated into production chain logic optimised in such a way that insolation of the rear face 92 of a first panel 90 on the second station 20 is concomitant with insolation of the rear side 91 of a second panel 90 on the first station 10.

The modes or embodiments described in the present specification are given by way of illustration and are non-limiting; in light of this specification a skilled person could easily modify these modes or embodiments or conceive others without departing from the scope of the invention.

In particular, the example described in the present specification comprises two insolation stations but it is understood that the machine could comprise a single insolation station. In such a case, once insolation of the front face 91 of the panel 90 is complete within the sole insolation station 10, the base 12 redescends and the frame 30 is moved opposite the base 12 to grip the panel 90 by means of the suction cups 53, 54. With the panel 90 firmly gripped by the strips 51, 52, the frame 40 moves horizontally away from the insolation station 10 as far as a position in which the frame 40 has sufficient space so it can be turned. Once it is turned, the frame 40 is brought back, head down, to the single insolation station 10. Once the frame 40 is opposite the base 12, the panel 90 is released and set down on the base 12: the latter can then rise again until it presses the work table 13 and the panel 90 against the platen 16 of the insolation unit 15: insolation of the rear face 92 of the panel 90 then occurs.

In addition, the different characteristics of these modes or embodiments can be used individually or be combined together. When they are combined, these characteristics can be as described hereinabove or variously, the invention not being limited to the specific combinations described in the present specification. In particular, unless expressed otherwise, a characteristic described in relation to a mode or embodiment can be applied similarly to another mode or embodiment.

The invention claimed is:

1. A machine for insolation of panels comprising:
   at least one insolation station comprising a base configured to receive a panel flat, and
   a panel turner, having a first face and a second face, wherein the panel turner comprises
   a prehension device configured to grip a panel,
   a displacement device configured to be able to guide the prehension device opposite the base of said at least one insolation station, and
   a pivoting device configured to pivot the prehension device and accordingly have the panel pivot about a pivoting axis parallel to said panel, the turner being configured so as to be able to grip the panel by any one of its faces and release the panel also by any one of its faces.

2. The machine for insolation of panels according to claim 1, comprising a first insolation station and a second insolation station, each insolation station comprising a base configured to receive the panel flat, and
   wherein the displacement device is configured to be able to guide the prehension device opposite the base of each insolation station.

3. The machine for insolation of panels according to claim 2, wherein the base of said at least one insolation station is fitted with an elevator allowing it to rise or descend.

4. The machine for insolation of panels according to claim 3, wherein said at least one insolation station also comprises an insolation unit fitted with an insolation device and configured to bear a plate, the insolation unit of the insolation station being fixed.

5. The machine for insolation of panels according to claim 2, wherein the turner comprises a support and a frame substantially rectangular cooperating with the support by means of two trunnions arranged on the frame, or on the support, coaxially and on either side of the frame, defining a pivoting axis of the frame relative to the support, said axis corresponding to said pivoting axis of the panel,
   wherein the frame comprises two longitudinal crossbars, preferably parallel to the pivoting axis, bearing the prehension device,
   wherein the pivoting device, carried preferably by the support, drives at least one of said trunnions to pivot the frame relative to the support.

6. The machine for insolation of panels according to claim 5, wherein the support cooperates with at least one rail of the insolation machine along which it is mobile and driven by the displacement device, and wherein said rail is horizontal, the displacement of the support being limited to horizontal displacement.

7. The machine for insolation of panels according to claim 6, wherein the strips of the same crossbar are offset relative to their pivoting axes such that they can extend side by side in the same plane or opposite, the suction cups of one being directed towards the suction cups of the other.

8. The machine for insolation of panels according to claim 5, wherein each crossbar comprises two strips each fitted with a rotary drive device, preferably a rotary jack, allowing it to pivot about a axis parallel to said crossbar, and wherein each strip is fitted with a plurality of controlled suction cups connected to a vacuum pump and acting as a prehension device.

9. The machine for insolation of panels according to claim 8, wherein at least one suction cup is fitted with an automatic valve which closes when no object is being applied to said suction cup.

10. The machine for insolation of panels according to claim 8, wherein at least one suction cup is fitted with a spring which pushes it away from the strip on which it is mounted.

11. The machine for insolation of panels according to claim 5, wherein that each crossbar is mounted between two opposite carriages, each carriage being mobile and driven along a rail of the frame.

12. The machine for insolation of panels according to claim 11, wherein each carriage cooperates with a guide bar arranged along said rail of the frame,
   wherein an Archimedes screw is arranged along at least one of said rails, and
   wherein some carriages comprise a motor meshing on said Archimedes screw to ensure they move along said rails.

13. The machine for insolation of panels according to claim 5, wherein the pivoting device comprises a motor mounted on the support, which drives, preferably by means of angle transmission reduction gearing, one of the trunnions of the frame to pivot the frame in a range of inclination of at least 180° in amplitude.

14. The machine for insolation of panels according to claim 1, wherein the turner comprises a support and a substantially rectangular frame cooperating with the support by means of two trunnions arranged on the frame, or on the support, coaxially and on either side of the frame, defining a pivoting axis of the frame relative to the support, said axis corresponding to said pivoting axis of the panel,
   wherein the frame comprises two longitudinal crossbars preferably parallel to the pivoting axis, bearing the prehension device, and
   wherein the pivoting device, carried preferably by the support, drives at least one of said trunnions to pivot the frame relative to the support.

* * * * *